United States Patent

Van Ngo et al.

Patent Number: 6,153,523
Date of Patent: Nov. 28, 2000

[54] METHOD OF FORMING HIGH DENSITY CAPPING LAYERS FOR COPPER INTERCONNECTS WITH IMPROVED ADHESION

[75] Inventors: Minh Van Ngo, Union City; Robin W. Cheung, Cupertino, both of Calif.

[73] Assignee: Advanced Micro Devices, Inc., Sunnyvale, Calif.

[21] Appl. No.: 09/208,245

[22] Filed: Dec. 9, 1998

[51] Int. Cl.[7] ................................. H01L 21/44
[52] U.S. Cl. ............... 438/687; 438/687; 438/627; 438/628; 438/643; 204/192; 204/298; 156/643; 156/646; 437/196; 437/198; 437/200
[58] Field of Search ................... 438/687, 627, 438/643, 628; 204/192, 298; 437/200, 196, 198; 156/643, 646, 345, 272

[56] References Cited

U.S. PATENT DOCUMENTS

| | | | |
|---|---|---|---|
| 4,731,156 | 3/1988 | Montmarquet | 156/643 |
| 5,343,064 | 8/1994 | Spangler et al. | 257/350 |
| 5,413,687 | 5/1995 | Barton et al. | 204/192 |
| 5,447,887 | 9/1995 | Filipiak et al. | 437/200 |
| 5,621,241 | 4/1997 | Jain | 257/632 |
| 5,693,563 | 12/1997 | Teong | 438/627 |
| 5,893,752 | 4/1999 | Zhang et al. | 438/687 |

*Primary Examiner*—David Nelms
*Assistant Examiner*—Phuc Dang

[57] ABSTRACT

The adhesion of a barrier or capping layer to a Cu or Cu alloy interconnect member is significantly enhanced by treating the exposed surface of the Cu or Cu alloy interconnect member, after CMP, with an ammonia-containing plasma and then depositing the capping layer, e.g., silicon nitride, under high density plasma conditions at an elevated temperature, such as about 450° C. to about 650° C., e.g. about 450° C. to about 550° C. High density plasma deposition at such elevated temperatures increases the surface roughness of the exposed Cu metallization, thereby further increasing adhesion of the silicon nitride capping layer and increasing the density of the silicon nitride capping layer, thereby improving its etch stop characteristics.

20 Claims, 2 Drawing Sheets

METHOD OF FORMING HIGH DENSITY CAPPING LAYERS FOR COPPER INTERCONNECTS WITH IMPROVED ADHESION

RELATED APPLICATIONS

This application contains subject matter related to subject matter disclosed in copending U.S. patent application Ser. No. 09/207,675 filed on Dec. 9, 1998.

TECHNICAL FIELD

The present invention relates to copper (Cu) and/or Cu alloy metallization in semiconductor devices. The present invention is applicable to manufacturing high speed integrated circuits having submicron design features and high conductivity interconnect structures.

BACKGROUND ART

The escalating requirements for high density and performance associated with ultra large scale integration semiconductor wiring require responsive changes in interconnection technology. Such escalating requirements have been found difficult to satisfy in terms of providing a low RC (resistance capacitance) interconnect pattern, particularly wherein submicron vias, contacts and trenches have high aspect ratios imposed by miniaturization.

Conventional semiconductor devices comprise a semiconductor substrate, typically doped monocrystalline silicon, and a plurality of sequentially formed dielectric interlayers and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via hole, while a conductive plug filling a contact hole establishes electrical contact with an active region on a semiconductor substrate, such as a source/drain region. Conductive lines are formed in trenches which typically extend substantially horizontal with respect to the semiconductor substrate. Semiconductor "chips" comprising five or more levels of metallization are becoming more prevalent as device geometries shrink to submicron levels.

A conductive plug filling a via hole is typically formed by depositing an interdielectric layer on a conductive layer comprising at least one conductive pattern, forming an opening through the interdielectric layer by conventional photolithographic and etching techniques, and filling the opening with a conductive material, such as tungsten (W). Excess conductive material on the surface of the dielectric interlayer is typically removed by chemical mechanical polishing (CMP). One such method is known as damascene and basically involves forming an opening in the dielectric interlayer and filling the opening with a metal. Dual damascene techniques involve forming an opening comprising a lower contact or via hole section in communication with an upper trench section, which opening is filled with a conductive material, typically a metal, to simultaneously form a conductive plug in electrical contact with a conductive line.

High performance microprocessor applications require rapid speed of semiconductor circuitry. The control speed of semiconductor circuitry varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. Miniaturization demands long interconnects having small contacts and small cross-sections. As the length of metal interconnects increases and cross-sectional areas and distances between interconnects decrease, the RC delay caused by the interconnect wiring increases. If the interconnection node is routed over a considerable distance, e.g., hundreds of microns or more as in submicron technologies, the interconnection capacitance limits the circuit node capacitance loading and, hence, the circuit speed. As design rules are reduced to about 0.18 micron and below, the rejection rate due to integrated circuit speed delays significantly reduces production throughput and increases manufacturing costs. Moreover, as line widths decrease electrical conductivity and electromigration resistance become increasingly important.

Cu and Cu alloys have received considerable attention as a candidate for replacing Al in interconnect metallizations. Cu is relatively inexpensive, easy to process, and has a lower resistivity than Al. In addition, Cu has improved electrical properties vis-a-vis W, making Cu a desirable metal for use as a conductive plug as well as conductive wiring.

An approach to forming Cu plugs and wiring comprises the use of damascene structures employing CMP, as in Teong, U.S. Pat. No. 5,693,563. However, due to Cu diffusion through interdielectric layer materials, such as silicon dioxide, Cu interconnect structures must be encapsulated by a diffusion barrier layer. Typical diffusion barrier metals include tantalum (Ta), tantalum nitride (TaN), titanium nitride (TiN), titanium-tungsten (TiW), tungsten (W), tungsten nitride (WN), Ti-TiN, titanium silicon nitride (TiSiN), tungsten silicon nitride (WSiN), tantalum silicon nitride (TaSiN) and silicon nitride for encapsulating Cu. The use of such barrier materials to encapsulate Cu is not limited to the interface between Cu and the dielectric interlayer, but includes interfaces with other metals as well.

There are additional problems attendant upon conventional Cu interconnect methodology employing a diffusion barrier layer (capping layer). For example, conventional practices comprise forming a damascene opening in an interdielectric layer, depositing a barrier layer such as TaN, lining the opening and on the surface of the interdielectric layer, filling the opening with Cu or a Cu alloy layer, CMP, and forming a capping layer on the exposed surface of the Cu or Cu alloy. It was found, however, that capping layers, such as silicon nitride, deposited by plasma enhanced chemical vapor deposition (PECVD), exhibit poor adhesion to the Cu or Cu alloy surface. Consequently, the capping layer is vulnerable to removal, as by peeling due to scratching or stresses resulting from subsequent deposition of layers. As a result, the Cu or Cu alloy is not entirely encapsulated and Cu diffusion occurs, thereby adversely affecting device performance and decreasing the electromigration resistance of the Cu or Cu alloy interconnect member. Moreover, conventional PECVD silicon nitride capping layers have a density of about 2.62 g/cm$^3$ and, hence, are not particularly effective as an etch stop layer during formation of interconnects for subsequent metallization levels.

In copending application Ser. No. 09/112,472 filed on Jul. 9, 1998, the adhesion problem of a PECVD silicon nitride capping layer to a Cu interconnect was addressed by initially treating the exposed surface with a hydrogen-containing plasma, forming a copper silicide layer on the treated surface and depositing a silicon nitride capping layer thereon. In copending application Ser. No. 09/131,872 filed on Aug. 10, 1998 the adhesion problem of a silicon nitride capping layer to a Cu interconnect was addressed by treating the exposed surface with an ammonia-containing plasma and depositing a silicon nitride capping layer thereon.

As design rules extend deeper into the submicron range, e.g., about 0.18 micron and under, the reliability of the interconnect pattern becomes particularly critical. Therefore, the adhesion of capping layers to Cu interconnects and the accuracy of interconnects for vertical metallization levels require even greater reliability. Accordingly, there exists a need for methodology enabling the formation of encapsulated Cu and Cu alloy interconnect members for vertical metallization levels with greater accuracy and reliability.

DISCLOSURE OF THE INVENTION

An advantage of the present invention is a method of manufacturing a semiconductor device having highly reliable Cu or Cu alloy interconnect members.

Another advantage of the present invention is a method of manufacturing a semiconductor device comprising a Cu or Cu alloy interconnect member having a dense silicon nitride capping layer tightly adhered thereto.

Additional advantages and other features of the present invention will be set forth in the description which follows and, in part, will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising: treating a surface of a copper (Cu) or Cu alloy layer with an ammonia-containing plasma; and forming a barrier layer on the treated surface of the Cu or Cu alloy layer under high density plasma conditions at a temperature of about 450° C. to about 650° C.

Embodiments of the present invention include forming an opening in an interdielectric layer, depositing an underlying diffusion barrier layer, such as TaN, lining the opening and on the interdielectric layer, depositing the Cu or a Cu alloy layer on the diffusion barrier layer filling the opening and over the interdielectric layer; removing any portion of the Cu or Cu alloy layer beyond the opening by CMP, leaving an exposed surface oxidized; treating the exposed surface of the Cu or Cu alloy layer with an ammonia-containing plasma; and depositing a silicon nitride barrier layer under high density plasma conditions on the treated surface.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

Figure 1:
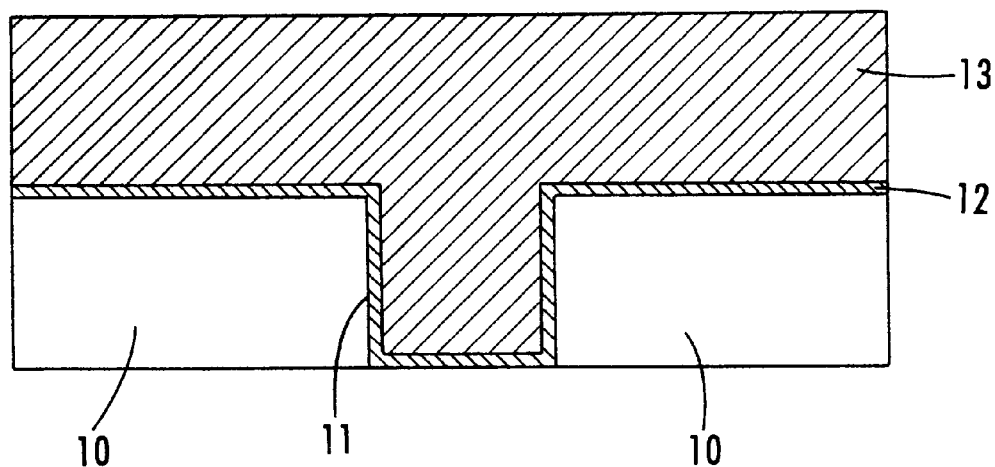
FIGS. 1–4 illustrate sequential phases of a method in accordance with an embodiment of the present invention.

The present invention addresses and solves problems attendant upon capping a Cu or Cu alloy interconnect, as with a capping layer of silicon nitride. Methodology in accordance with embodiments of the present invention enables a significant improvement in the adhesion of a capping layer, such as silicon nitride, to a Cu or Cu alloy interconnect member, thereby preventing capping layer peeling, preventing copper diffusion and enhancing electromigration resistance. In addition, the present invention provides methodology enabling the deposition of a capping layer, such as silicon nitride, having a significantly increased density thereby significantly enhancing the ability of the capping layer to function as an etch stop layer during formation of interconnects for subsequent metallization levels. As employed throughout this application, the symbol Cu is intended to encompass high purity elemental copper as well as Cu-based alloys, such as Cu alloys containing minor amounts of tin, zinc, maganese, titanium, magnesium and germanium.

As design rules are scaled down into the deep submicron range, e.g., about 0.18 micron and under, the reliability of encapsulated Cu and/or Cu alloy interconnect members becomes increasingly significant. It was found that conventional practices in forming a Cu and/or Cu alloy interconnect member in a damascene opening result in the formation of a thin copper oxide surface film, believed to comprise a mixture of CuO and $Cu_2O$ formed during CMP. The thin copper oxide surface film layer is porous and brittle in nature. The presence of such a thin copper oxide surface film undesirably reduces the adhesion of a capping layer, such as silicon nitride, to the underlying Cu and/or Cu alloy interconnect member. Consequently, cracks are generated at the Cu or Cu alloy/copper oxide interface, resulting in copper diffusion and increased electromigration as a result of such diffusion. The cracks occurring in the Cu or Cu alloy/copper oxide interface enhance surface diffusion, which is more rapid than grain boundary diffusion or lattice diffusion. The hydrogen plasma treatment disclosed in copending application Ser. No. 09/112,472 and the ammonia plasma treatment disclosed in copending application Ser. No. 09/131,872 improve adhesion of a silicon nitride capping layer to the Cu or Cu alloy layer. The present invention constitutes an improvement over the methodology disclosed in such copending applications by further significantly improving adhesion of the capping layer, such as silicon nitride, by roughening the surface of the Cu or Cu alloy interconnect member prior to depositing the capping layer thereon. In addition, the inventive methodology enables the deposition of a capping layer, such as silicon nitride, having a significantly increased density vis-a-vis that produced by conventional practices, thereby significantly improving its etch stopping ability. In accordance with embodiments of the present invention, the exposed surface of the Cu and/or Cu alloy layer is treated with an ammonia-containing plasma prior to forming the capping layer, e.g., silicon nitride, on the Cu or Cu alloy layer. Treatment with the ammonia-containing plasma effectively cleans the exposed surface of the Cu or Cu alloy interconnect member, as by substantially reducing or removing copper oxides from the surface thereof, thereby presenting a clean Cu or Cu alloy surface, thereby enhancing adhesion of the silicon nitride capping layer thereon. In accordance with embodiments of the present invention, the capping layer, e.g., silicon nitride, is deposited under high density plasma conditions at a significantly higher temperature than employed in conventional silicon nitride plasma enhanced chemical vapor deposition techniques for capping Cu metallization.

Thus, silicon nitride capping layers are deposited under high density plasma conditions at a temperature of at least about 450° C.

In accordance with embodiments of the present invention, a capping layer is deposited on Cu metallization at a temperature of about 450° C. to about 650° C., e.g. about 450° C. to about 550° C., under high density plasma conditions. High density plasma oxides have previously been employed in gap filling, as disclosed by Jain, U.S. Pat. No. 5,621,241.

The use of high density plasma conditions at an elevated temperature of about 450° C. or greater provides significant advantages. For example, in accordance with embodiments of the present invention, the formation of a high density plasma silicon nitride capping layer on Cu metallization increases the surface roughness of the Cu metallization, thereby further improving adhesion of the silicon nitride capping layer to the Cu metallization. In addition, the use of high density plasma conditions results in a silicon nitride capping layer exhibiting a significantly denser film compared to PECVD silicon nitride capping layers deposited by conventional practices, e.g. a density of 2.67 to about 2.77 g/cm$^3$. Silicon nitride capping layers having such an increased density can effectively serve as etch stop layers when forming interconnects for subsequent metallization levels.

Cu and/or Cu alloy interconnect members formed in accordance with embodiments of the present invention can be, but are not limited to, interconnects formed by damascene technology. Thus, embodiments of the present invention include forming an interdielectric layer overlying a substrate, forming an opening, e.g., a damascene opening, in the interdielectric layer, depositing a diffusion barrier layer, such as TaN, and filling the opening with Cu or a Cu alloy layer. Advantageously, the opening in the interdielectric layer can be filled by initially depositing a seed layer and then electroplating or electroless plating the Cu or Cu alloy layer. CMP is then performed such that the upper surface of the Cu or Cu alloy layer is substantially coplanar with the upper surface of the interdielectric layer. As a result of CMP, a thin film of copper oxide is typically formed. In accordance with embodiments of the present invention, the exposed oxidized surface of the Cu or Cu alloy is treated with an ammonia-containing plasma to remove or substantially reduce the thin copper oxide film, thereby presenting a clean surface upon which a diffusion barrier layer or capping layer, such as silicon nitride, is then deposited, e.g. directly deposited, under high density plasma conditions.

Given the present disclosure and the objectives of the present invention, the conditions during ammonia plasma treatment and formation of the high density plasma capping layer, such as silicon nitride, can be optimized in a particular situation. For example, it was found suitable to treat the exposed surface of the Cu or Cu alloy layer with a ammonia-containing plasma at an ammonia flow rate of about 50 to about 1,000 sccm, a pressure of about 5 mTorr. to about 1.0 Torr., a temperature of about 250° C. to about 350° C., a source power of about 1,000 to about 7,000 watts, and a bias power of about 1,000 to about 6,000 wats for about 2 seconds to about 20 seconds. It was also found suitable to deposit a silicon nitride capping layer under high density plasma conditions, i.e.; at a silane flow rate of about 20 to about 500 sccm, an ammonia flow rate of about 50 to about 1,000 sccm, a pressure of about 5 mTorr. to about 1.0 Torr, and a temperature of about 450° C. to about 650° C., such as about 450° C. to about 550° C., a source power of about 1,000 to about 7,000 watts, and a bias power of about 1,000 to about 6,000 watts, for about 10 seconds to about 100 seconds, which typically yields a silicon nitride capping layer having a thickness of about 300 Å to about 1,000 Å and a density of about 2.67 to about 2.77 g/cm$^3$. Advantageously, treatment of the Cu metallization with an ammonia-containing plasma and high density plasma deposition of the silicon nitride capping layer are conducted in the same CVD apparatus or tool.

In accordance with embodiments of the present invention, the damascene opening can also be filled with Cu or a Cu alloy by PVD at a temperature of about 50° C. to about 150° C. or by CVD at a temperature under about 200° C. In various embodiments of the present invention, conventional substrates and interdielectric layers, can be employed. For example, the substrate can be doped monocrystalline silicon or gallium-arsenide. The interdielectric layer employed in the present invention can comprise any dielectric material conventionally employed in the manufacture of semiconductor devices. For example, dielectric materials such as silicon dioxide, phospho-silicate-glass (PSG), boron doped PSG (BPSG), and silicon dioxide derived from tetraethylorthosilicate (TEOS) or silane by PECVD can be employed. The openings formed in dielectric layers are effected by conventional photolithographic and etching techniques. Interdielectric layers in accordance with the present invention can also comprise low dielectric constant materials, including polymers, such as polyimides.

An embodiment of the present invention is schematically illustrated in FIGS. 1–4, wherein similar reference numerals denote similar features. Adverting to FIG. 1, damascene opening 11, such as a contact or via hole, is formed in dielectric layer 10, e.g., silicon dioxide. It should be understood that opening 11 can also be formed as a dual damascene opening comprising a contact or via hole section in communication with a trench section. A barrier layer 12 is deposited, such as TaN. Cu or a Cu alloy layer 13 is then deposited. Upon electroplating or electroless plating layer 13, a seed layer (not shown) is deposited on barrier layer 12.

Figure 2:
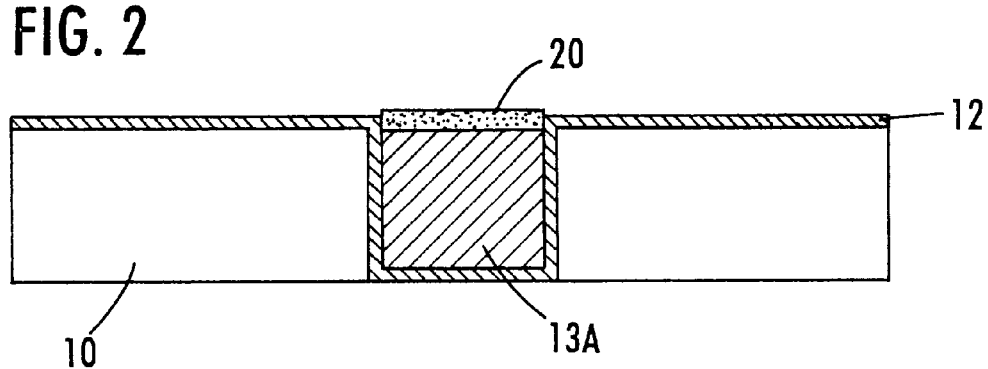

Adverting to FIG. 2, the portions of the Cu or Cu alloy layer 13 extending beyond opening 11 are removed, as by CMP. As a result, a thin film of copper oxide 20 is formed on the exposed surface of the Cu or Cu alloy interconnect member 13A.

Figure 3:
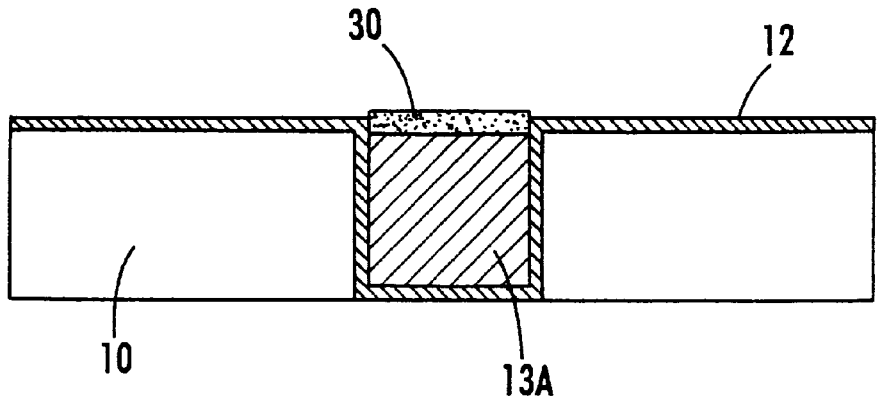

Adverting to FIG. 3, in accordance with embodiments of the present invention, the exposed surface of the Cu or Cu alloy interconnect member 13A having a thin copper oxide film 20 thereon is treated with an ammonia-containing plasma to remove or substantially reduce the thin copper oxide film 20 leaving a clean reduced Cu or Cu alloy surface 30.

Figure 4:
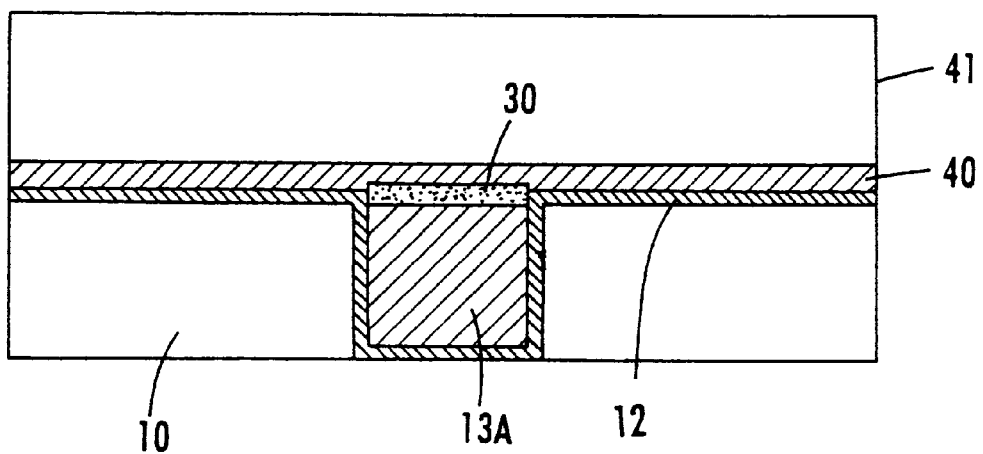

As shown in FIG. 4, a high density plasma capping layer 40, such as silicon nitride, is then formed on the cleaned exposed surface 30 of Cu or Cu alloy interconnect 13, in accordance with the present invention under high density plasma conditions, with an attendant roughening of surface 30, thereby further improving the adhesion of high density plasma layer 40 thereto. The high density plasma silicon nitride capping layer completely encapsulates the Cu or Cu alloy interconnect 13. Another interdielectric layer 41 is then deposited, such as silicon dioxide derived from TEOS or silane. In this way, a plurality of dielectric interlayers and metallization patterns are built up on a semiconductor substrate and various interconnects are formed. Advantageously, the high density plasma silicon nitride capping layer 40 is tightly adhered to the underlying Cu or Cu alloy interconnect 13A by virtue of employing high density plasma conditions, including an elevated temperature of about 450° C. to about 650° C., and by initially treating the exposed surface of the Cu or Cu alloy interconnect 13A with a ammonia-containing plasma to remove the thin oxide film 20 (FIG. 2) generator as a result of CMP. In addition, high density plasma silicon nitride capping layer 40 advantageously exhibits significantly improved etch stop properties by virtue of its high density, e.g. a density of about 2.67 to about 2.77 g/cm$^3$, thereby improving the accuracy and reliability of interconnects for subsequent metallization levels.

The present invention enables the formation of extremely reliable Cu and/or Cu alloy interconnect members by enhancing the adhesion and increasing the density of a capping layer, such as silicon nitride, thereon. The removal or substantial reduction of a thin copper oxide film from the surface of the Cu and/or Cu alloy interconnect member by treatment with an ammonia-containing plasma significantly improves the reliability of the Cu and/or Cu alloy interconnect member by enhancing adhesion of the high density plasma capping layer with an attendant reduction in copper diffusion and increase in electromigration resistance. The use of high density plasma conditions in forming the silicon nitride capping layer results in increased adhesion of the capping layer and a increased density, thereby advantageously enabling the high density plasma silicon nitride layer to function effectively as an etch stop layer during formation of subsequent metallization levels. Consequently, the present invention advantageously reduces capping layer peeling, reduces copper diffusion, enhances electromigration resistance, improves device reliability, increases production throughput and reduces manufacturing costs.

The present invention enjoys industrial applicability in the formation of various types of inlaid Cu and Cu alloy metallization interconnection patterns. The present invention is particularly applicable to manufacturing semiconductor devices having submicron features and high aspect ratio openings.

In the previous description, numerous specific details are set forth, such as specific materials, structures, chemicals, processes, etc., to provide a better understanding of the present invention. However, the present invention can be practiced without resorting to the details specifically set forth. In other instances, well known processing and materials have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device, the method comprising:
   treating a surface of a copper (Cu) or Cu alloy layer with an ammonia-containing plasma; and
   forming a barrier layer on the treated surface of the Cu or Cu alloy layer under high density plasma conditions at a temperature of about 450° C. to about 650° C.

2. The method according to claim 1, comprising forming a silicon nitride barrier layer on the treated surface of the Cu or Cu alloy layer.

3. The method according to claim 2, wherein:
   treating the surface of the Cu or Cu alloy layer with the ammonia-containing plasma reduces copper oxides on the surface; and
   depositing the silicon nitride barrier layer under high density plasma conditions roughens the surface of the Cu or Cu alloy layer, thereby increasing adhesion of the silicon nitride layer to the Cu or Cu alloy layer.

4. The method according to claim 2, comprising treating the surface of the Cu or Cu alloy layer with an ammonia-containing plasma at:
   an ammonia flow rate of about 50 to about 1,000 sccm:
   a source power of about 1,000 to about 7,000 watts;
   a bias power of about 1,000 to about 6,000 watts;
   a temperature of about 250° C. to about 350° C.; and
   a pressure of about 5 mTorr. to about 1.0 Torr.

5. The method according to claim 4, comprising depositing the silicon nitride barrier layer under high density plasma conditions at:
   a pressure of about 5 mTorr. to about 1.0 Torr.;
   a source power of about 1,000 to about 7,000 watts;
   a bias power of about 1,000 to about 6,000 watts;
   a silane flow rate of about 20 to about 500 sccm; and
   an ammonia flow rate of about 50 to about 1000 sccm.

6. The method according to claim 4, comprising treating the surface of the Cu or Cu alloy layer with the ammonia-containing plasma for about 2 seconds to about 20 seconds.

7. The method according to claim 5, comprising depositing the silicon nitride barrier layer under high density plasma conditions for about 10 seconds to about 100 seconds.

8. The method according to claim 1, comprising depositing the barrier layer under high density plasma conditions at a temperature of about 450° C. to about 550° C.

9. The method according to claim 1, comprising treating the surface of the Cu or Cu alloy layer with the ammonia-containing plasma and depositing the silicon nitride barrier layer under high density plasma conditions in the same tool.

10. The method according to claim 1, comprising:
    depositing an underlying diffusion barrier layer on a dielectric layer;
    depositing a seed layer on the diffusion barrier layer; and
    electroplating or electroless plating the Cu or Cu alloy layer on the seed layer.

11. A method of manufacturing a semiconductor device, the method comprising:
    forming an interdielectric layer overlying a substrate;
    forming an opening in the interdielectric layer;
    depositing copper (Cu) or a Cu alloy layer in the opening and over the interdielectric layer;
    removing any portion of the Cu or Cu alloy layer beyond the opening by chemical mechanical polishing, leaving an exposed surface oxidized;
    treating the exposed oxidized surface with an ammonia-containing plasma; and
    forming a barrier layer on the treated surface of the Cu or Cu alloy layer.

12. The method according to claim 11, comprising:
    forming an underlying diffusion barrier layer in the opening; and
    depositing the Cu or Cu alloy layer on the underlying diffusion barrier layer.

13. The method according to claim 12, comprising:
    depositing a seed layer on the underlying diffusion barrier layer; and
    electroplating or electroless plating the Cu or Cu alloy layer on the seed layer.

14. The semiconductor device according to claim 2, wherein the high density plasma silicon nitride diffusion barrier layer has a density of about 2.67 to about 2.77 g/cm$^3$.

15. The method according to claim 11, comprising:
forming a silicon nitride barrier layer on the treated surface of the Cu or Cu alloy layer.

16. The method according to claim 1, comprising:
forming the barrier layer on the treated surface of the Cu or Cu alloy layer under high density plasma conditions at a temperature greater than 450° C.

17. The method according to claim 1, comprising:
chemical-mechanical polishing the Cu or Cu alloy layer before treating the surface with an ammonia-containing plasma.

18. The method according to claim 1, comprising:
forming the barrier layer directly on the treated surface of the Cu or Cu alloy layer.

19. The method according to claim 1, comprising:
forming the Cu or Cu alloy layer over a semiconductor substrate prior to treating the surface with an ammonia-containing plasma.

20. The method according to claim 1, wherein the Cu or Cu alloy layer comprises part of an interconnect.

* * * * *